US010032679B1

(12) United States Patent
Guo et al.

(10) Patent No.: US 10,032,679 B1
(45) Date of Patent: Jul. 24, 2018

(54) SELF-ALIGNED DOPING IN SOURCE/DRAIN REGIONS FOR LOW CONTACT RESISTANCE

(71) Applicant: International Business Machines Corporation, Armonk, NY (US)

(72) Inventors: Dechao Guo, Niskayuna, NY (US); Zuoguang Liu, Schenectady, NY (US); Gen Tsutsui, Glenmont, NY (US); Heng Wu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/802,929

(22) Filed: Nov. 3, 2017

Related U.S. Application Data

(63) Continuation of application No. 15/404,466, filed on Jan. 12, 2017.

(51) Int. Cl.
*H01L 21/8238* (2006.01)
*H01L 21/324* (2006.01)
(Continued)

(52) U.S. Cl.
CPC ........... *H01L 21/823821* (2013.01); *H01L 21/26513* (2013.01); *H01L 21/324* (2013.01); *H01L 21/823437* (2013.01); *H01L 27/0924* (2013.01); *H01L 29/1033* (2013.01); *H01L 29/165* (2013.01)

(58) Field of Classification Search
CPC ............ H01L 27/0924; H01L 27/1211; H01L 21/823821; H01L 21/823431; H01L 21/823412; H01L 21/823892; H01L 21/3081; H01L 21/823418; H01L 29/41791
See application file for complete search history.

(56) References Cited

U.S. PATENT DOCUMENTS 9,741,622 B2 * 8/2017 Jacob .............. H01L 21/823821
2014/0225168 A1 * 8/2014 Pham ................ H01L 29/66795
257/288

(Continued)

OTHER PUBLICATIONS

List of IBM Patents or Patent Applications Treated as Related (Appendix P); Filed Nov. 3, 2017, 2 pages.

*Primary Examiner* — Jaehwan Oh
*Assistant Examiner* — John M Parker
(74) *Attorney, Agent, or Firm* — Cantor Colburn LLP; Vazken Alexanian

(57) ABSTRACT

Embodiments are directed to a method of forming a semiconductor device and resulting structures having reduced source/drain contact resistance. The method includes forming a first semiconductor fin in a first region of a substrate and a second semiconductor fin in a second region of the substrate. A first gate is formed over a first channel region of the first semiconductor fin and a second gate is formed over a first channel region of the second semiconductor fin. A first doped region is formed on the first semiconductor fin, adjacent to the first gate. A second doped region is formed in a top portion of the first doped region and a third doped region is formed in a top portion of the second semiconductor fin. The third doped region is removed to form a recess and the recess is filled with a fourth doped region.

18 Claims, 14 Drawing Sheets

(51) Int. Cl.
*H01L 21/265* (2006.01)
*H01L 29/10* (2006.01)
*H01L 29/165* (2006.01)
*H01L 21/8234* (2006.01)
*H01L 27/092* (2006.01)

(56) References Cited

U.S. PATENT DOCUMENTS

| | | | | |
|---|---|---|---|---|
| 2016/0126249 | A1* | 5/2016 | Divakaruni | H01L 27/11568 |
| | | | | 257/324 |
| 2016/0343623 | A1* | 11/2016 | Fogel | H01L 21/823878 |
| 2017/0243977 | A1* | 8/2017 | Lin | H01L 29/7851 |
| 2018/0006118 | A1* | 1/2018 | Mallela | H01L 29/1037 |

* cited by examiner

SELF-ALIGNED DOPING IN SOURCE/DRAIN REGIONS FOR LOW CONTACT RESISTANCE

DOMESTIC AND/OR FOREIGN PRIORITY

This application is a continuation of U.S. application Ser. No. 15/404,466, titled "SELF-ALIGNED DOPING IN SOURCE/DRAIN REGIONS FOR LOW CONTACT RESISTANCE" filed Jan. 12, 2017, the entire contents of which are incorporated herein by reference.

BACKGROUND

The present invention relates in general to semiconductor device fabrication methods and resulting structures. More specifically, the present invention relates to fabrication methods and resulting structures for a semiconductor device having reduced contact resistance.

In contemporary semiconductor device fabrication processes, a large number of semiconductor devices, such as field effect transistors (FETs) and on-chip capacitors, are fabricated on a single wafer. Some non-planar device architectures, such as vertical field effect transistors (VFETs), employ semiconductor fins and side-gates that can be contacted outside the active region, resulting in increased device density and some increased performance over lateral devices. A typical VFET device includes a vertical fin or nanowire that extends upward from the substrate. The fin or nanowire forms the channel region of the transistor. A source region and a drain region are situated in electrical contact with the top and bottom ends of the channel region, and the gate is disposed on one or more of the fin or nanowire sidewalls.

SUMMARY

According to one or more embodiments of the present invention, a method of fabricating a semiconductor device having reduced source/drain contact resistance is provided. A first semiconductor fin is formed in a first region of a substrate and a second semiconductor fin is formed in a second region of the substrate. The method further includes forming a first gate over a first channel region of the first semiconductor fin and a second gate over a first channel region of the second semiconductor fin. The method further includes forming a first doped region on the first semiconductor fin, adjacent to the first gate. The method further includes forming a second doped region in a top portion of the first doped region and a third doped region in a top portion of the second semiconductor fin. The method further includes removing the third doped region to form a recess and filling the recess with a fourth doped region.

According to one or more embodiments of the present invention, a method of fabricating a semiconductor device having reduced source/drain contact resistance is provided. A first semiconductor fin is formed in a first region of a substrate and a second semiconductor fin is formed in a second region of the substrate. The method further includes forming a first plurality of adjacent gates, each gate formed over a channel region of the first semiconductor fin. The method further includes forming a second plurality of adjacent gates such that each gate is formed over a channel region of the second semiconductor fin. The method further includes forming a plurality of first doped regions on the first semiconductor fin such that each of the first doped regions is formed between adjacent gates. The method further includes concurrently forming a plurality of second doped regions and a plurality of third doped regions such that each of the second doped regions is formed in a top portion of a first doped region and each of the third doped regions formed in a top portion of the second semiconductor fin. The method further includes removing the plurality of third doped regions to form a plurality of recesses in the second semiconductor and forming a plurality of fourth doped regions such that each of the fourth doped regions formed in a recess.

According to one or more embodiments of the present invention, a semiconductor device having reduced source/drain contact resistance is provided. The structure includes a first semiconductor fin formed in a pFET region of a substrate and a second semiconductor fin formed in a nFET region of the substrate. The structure further includes a first gate formed over a first channel region of the first semiconductor fin and a second gate formed over a first channel region of the second semiconductor fin. The structure further includes a first doped region formed on the first semiconductor fin and adjacent to the first gate. The first doped region includes p-type dopants doped silicon germanium (SiGe). The p-type dopants include gallium (Ga), boron (B), difluoroboron ($BF_2$), and aluminum (Al). The structure further includes a second doped region formed on the second semiconductor fin and adjacent to the second gate. The second doped region is embedded below a surface of the second semiconductor fin.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
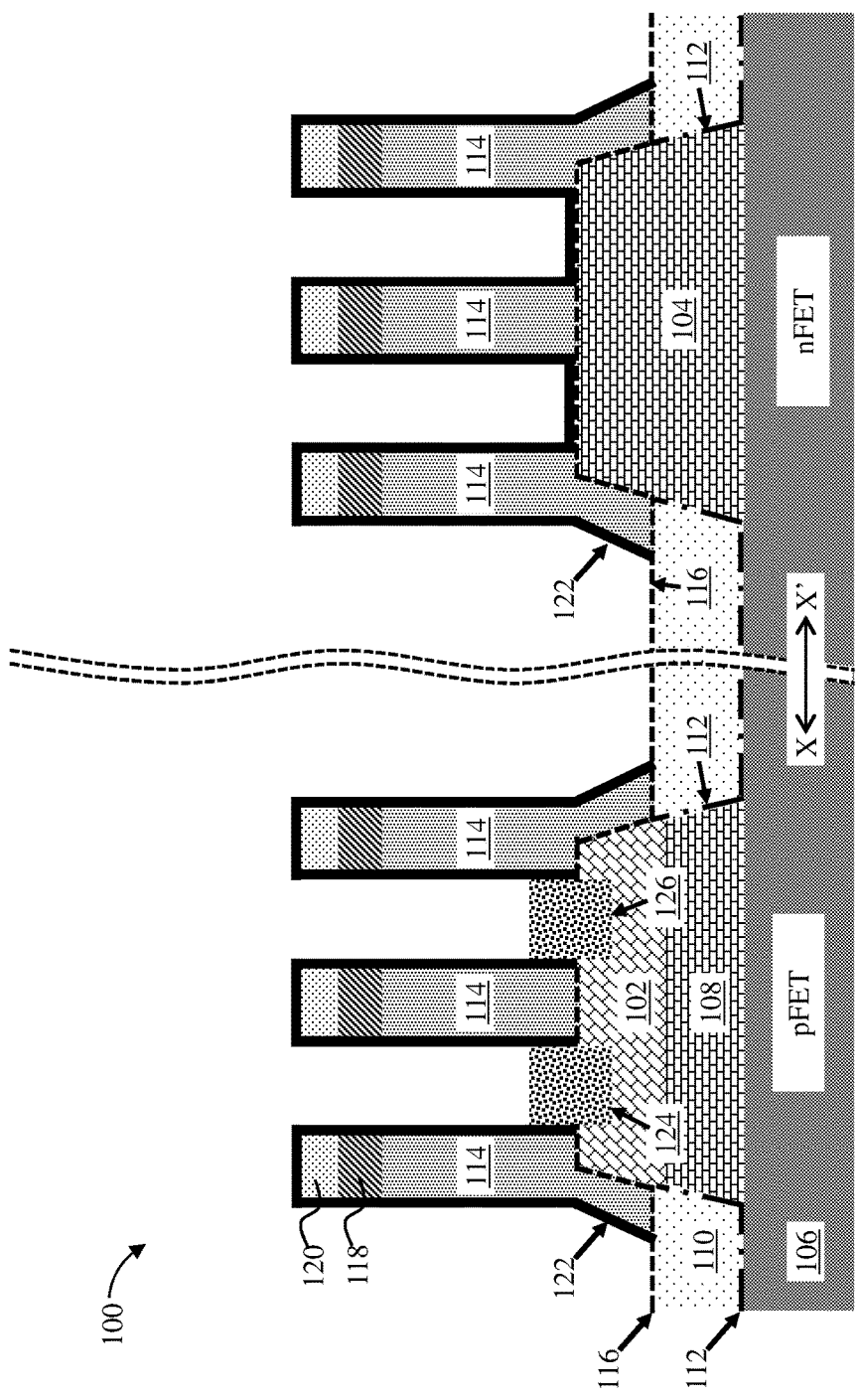
FIG. 1 depicts a cross-sectional view of a structure along a direction X-X' (parallel to fin direction) having semiconductor fins formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" means that the thickness of, e.g., a conformal liner, is substantially the same on all surfaces, or that the thickness variation is less than 15% of the nominal thickness.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to aspects of the present invention, as previously noted herein, one technique for scaling semiconductor architectures is to employ non-planar device architectures such as a VFET. There are challenges, however, in scaling non-planar architectures beyond the 10 nm node. One challenge in further scaling VFETs is a corresponding increase in source/drain contact resistance as the pitch, or centerline-to-centerline distance, between adjacent fins is decreased. Increasing contact resistivity causes a loss in device performance. Consequently, future nodes require contact resistivities of less than about $2.5 \times 10^{-9}$ $\Omega \cdot cm^{-2}$. Conventional VFET scaling processes, however, result in source/drain contact resistances greater than about $3.0 \times 10^{-9}$ $\Omega \cdot cm^{-2}$ (typically about $7.0 \times 10^{-9}$ $\Omega \cdot cm^{-2}$). One approach to reduce this contact resistance further is to dope the source/drain epitaxy. Gallium (Ga) doping a SiGe source/drain epitaxy, for example, greatly improves pFET contact resistance. The conventional integration of ion implantation doping into CMOS process flows is difficult and requires extra lithography, resulting in a more complex process, especially at the trench level. Thus, a method is desired for reducing the source/drain contact resistance in a semiconductor device without the need for additional lithography.

Turning now to an overview of the aspects of the present invention, one or more embodiments described herein provide methods of fabricating a semiconductor device having reduced source/drain contact resistance. Semiconductor fins and sacrificial gates are formed in pFET and nFET regions of a substrate. A blanket p-type dopant (such as, e.g., Ga, boron (B), difluoroboron ($BF_2$), and aluminum (Al)) ion implantation process dopes source/drain regions in the pFET region to reduce the source/drain contact resistivity of the pFET to less than about $2.5 \times 10^{-9}$ $\Omega \cdot cm^{-2}$. Portions of the semiconductor fin in the nFET region are allowed to be doped, i.e., a block mask is not formed over the nFET region prior to the blanket ion implantation, because the doped portions in the nFET region are removed during a later operation. An embedded source/drain is formed in the nFET region to replace the removed doped portions. In this manner, the p-type dopant ion implantation process occurs at the post epitaxy level in a simplified process (i.e., without the need for additional hard masks or other lithography). Consequently, only a single mask is required to achieve both nFET and pFET source/drain doping. Moreover, the simplified process also results in both an embedded nFET source/drain epitaxy and a p-type dopant-rich pFET.

Example methods for fabricating a semiconductor device having a reduced source/drain contact resistance and the resulting structures therefrom in accordance with embodiments of the present invention are described in detail below by referring to the accompanying drawings in FIGS. 1-14.

FIG. 1 illustrates a cross-sectional view of a structure 100 along a direction X-X' (parallel to fin direction) having semiconductor fins 102 and 104 formed on a substrate 106 during an intermediate operation of a method of fabricating a semiconductor device according to one or more embodiments of the present invention. The semiconductor fins 102 and 104 can be formed on the substrate 106 using known VFET fabrication techniques. For example, in some embodiments, a patterned hard mask (not depicted) is etched to expose portions of the substrate 106. The exposed portions of the substrate 106 can then be removed to form a plurality of semiconductor fins. The patterned hard mask is then removed using an etch process, which can be a wet etch process, a dry etch process or a combination thereof.

The semiconductor fins 102 and 104 can be made of any suitable material, such as, for example, Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials. In some embodiments, the semiconductor fin 102 is a SiGe pFET fin and the semiconductor fin 104 is a Si nFET fin. In some embodiments, the semiconductor fin 102 is a SiGe fin having a Ge concentration of about 20 percent. In some embodiments, the semiconductor fin 102 is formed on a Si layer 108. In other embodiments, the semiconductor fin 102 is formed directly over the substrate 106.

The substrate 106 can be made of any suitable substrate material, such as, for example, monocrystalline Si, SiGe, SiC, III-V compound semiconductor, II-VI compound semiconductor, or semiconductor-on-insulator (SOI). In some embodiments, the substrate 106 includes a buried oxide layer (not depicted). In some embodiments, the substrate 106 includes both an nFET Region and a pFET Region. In some embodiments, the substrate 106 includes either an nFET Region or a pFET Region.

In some embodiments, a dielectric layer 110 is formed on the substrate 106. The dielectric layer 110 can be made of any suitable dielectric material, such as, for example, porous silicates, carbon doped oxides, silicon dioxide, silicon nitrides, silicon oxynitrides, or other dielectric materials. Any known manner of forming the dielectric layer 110 can be utilized. The dielectric layer 110 can be formed using, for example, CVD, PECVD, ALD, flowable CVD, spin-on dielectrics, or PVD. In some embodiments, a liner 112 is formed between the dielectric layer 110 and the substrate 106 and between the dielectric layer 110 and the semiconductor fins 102 and 104. The liner 112 can be made of any suitable material, such as, for example, a silicon nitride, silicon dioxide, a silicon oxynitride (SiON), a silicon carbide (SiC), a silicon oxygen carbonitride (SiOCN), or a silico-boron carbonitride (SiBCN).

Sacrificial gates 114 are formed over channel regions of the semiconductor fins 102 and 104. The sacrificial gates 114 can be made of any suitable material, such as, for example, amorphous silicon (a-Si) or polysilicon. Any known method for patterning a sacrificial gate (also known as a dummy gate) can be used, such as, for example, a wet etch, a dry etch, or a combination of sequential wet and/or dry etches. For example, in some embodiments, a layer of a-Si is etched using a patterned hard mask (not depicted) to form the sacrificial gates 114. In some embodiments, an oxide layer 116 is formed between the sacrificial gates 114 and the dielectric layer 110 and between the sacrificial gates 114 and the semiconductor fins 102 and 104. The oxide layer 116 can be made of any suitable material, such as, for example, a silicon oxide, silicon dioxide, SiON, or SiOCN. In some embodiments, hard masks 118 are formed on each of the sacrificial gates 114. The hard mask 118 can be made of any suitable material, such as, for example, a silicon nitride, silicon dioxide, SiON, SiC, SiOCN, or SiBCN. In some embodiments, a thin silicon oxide film (not depicted) is formed between the hard mask 118 and the sacrificial gate 114. In some embodiments, a dielectric layer 120 is formed on the hard mask 118. The dielectric layer 120 can be made of any suitable dielectric material, such as, for example, porous silicates, carbon doped oxides, silicon dioxide, silicon nitrides, silicon oxynitrides, or other dielectric materials. For ease of illustration, only a single hard mask 118 and dielectric layer 120 is provided with a reference number.

In some embodiments, spacers 122 are formed on the sacrificial gates 114 and semiconductor fins 102 and 104. In some embodiments, the spacers 122 are formed using a CVD, PECVD, ALD, PVD, chemical solution deposition, or other like process in combination with a wet or dry etch process. The spacers 122 can be made of any suitable material, such as, for example, a low-k dielectric, a nitride, silicon nitride, silicon dioxide, SiON, SiC, SiOCN, or SiBCN.

Figure 7:
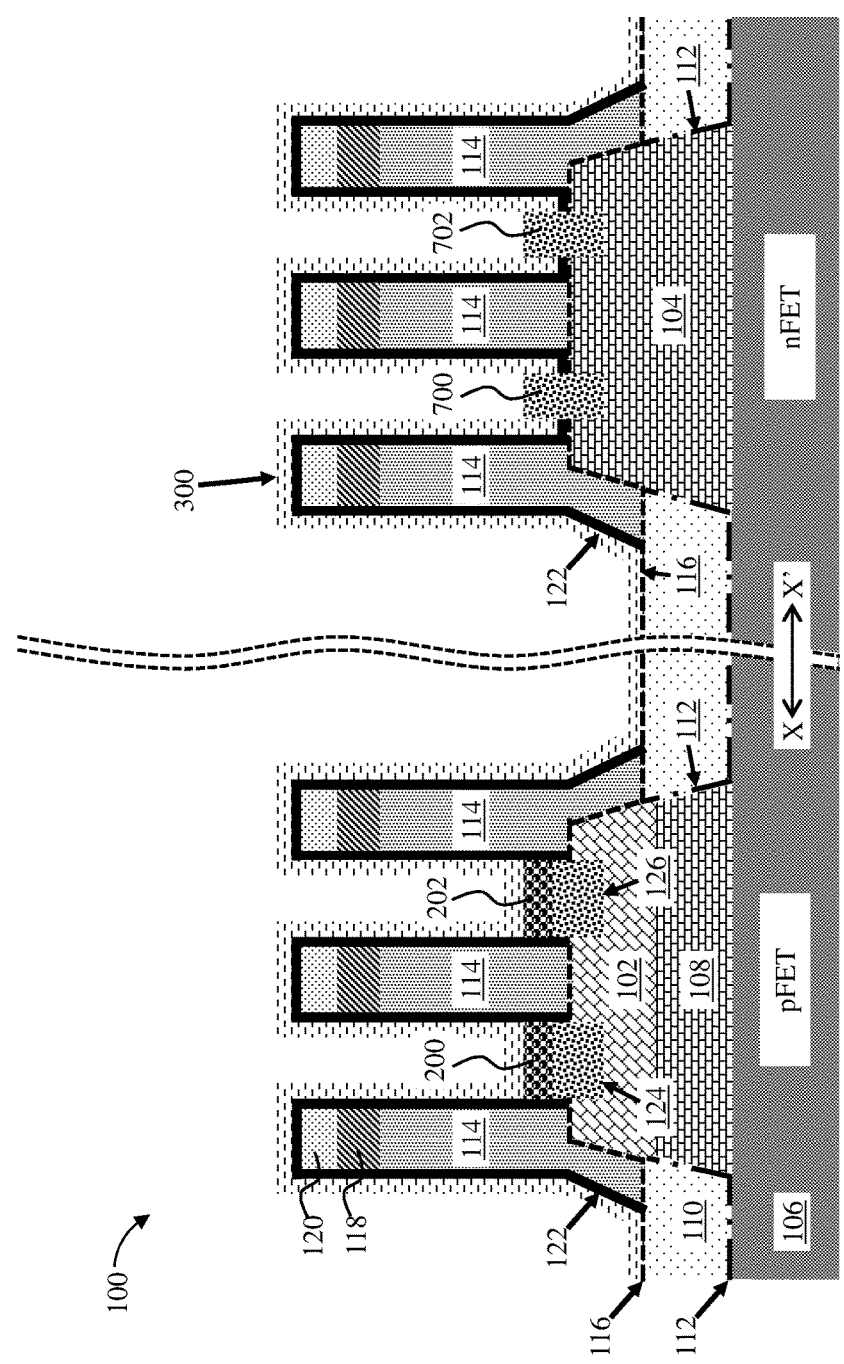
FIG. 7 depicts a cross-sectional view of the structure along the direction X-X' after forming doped regions in the n-fin recesses during an intermediate operation of a method of fabricating a semiconductor device according to one or more embodiments of the present invention.

Doped regions 124 and 126 are formed on the semiconductor fin 102. The doped regions 124 and 126 can be source or drain regions formed in the substrate 106 by a variety of methods, such as, for example, in-situ doped epitaxy, doped following the epitaxy, or by implantation and plasma doping. In some embodiments, the doped regions 124 and 126 are complementary, such that one of the doped regions is a source while the other is a drain. In embodiments having both nFET and pFET regions the doped regions 124 and 126 are p-type doped regions and the doped regions 700 and 702 (as depicted in FIG. 7) are n-type doped regions. In some embodiments, the semiconductor fin 102 is a SiGe fin having a Ge concentration of about 20 percent and the doped regions 124 and 126 are Ge doped SiGe regions having a Ge concentration of about 40 percent to about 90 percent. In some embodiments, the Ge concentration is about 70 percent. In this manner, the Ge concentration in the doped regions 124 and 126 can be higher than the Ge concentration in the semiconductor fin 102.

The doped regions 124 and 126 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the doped regions 124 and 126 include epitaxial semiconductor materials grown from gaseous or liquid precursors. In some embodiments, epitaxial regions are epitaxially grown over the substrate 106. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions 124 and 126 can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions 124 and 126 include silicon. In some embodiments, the doped regions 124 and 126 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Figure 2:
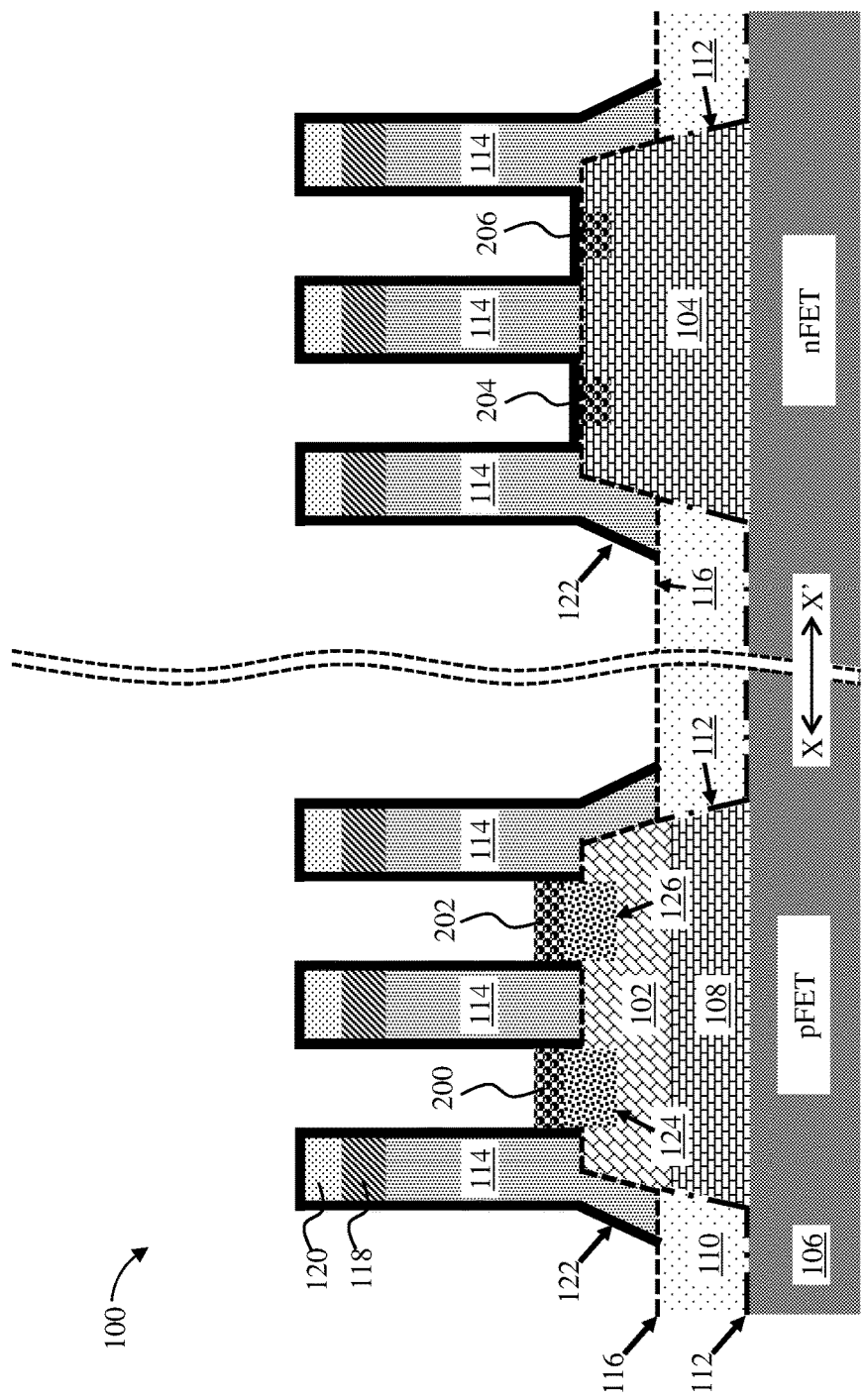
FIG. 2 depicts a cross-sectional view of the structure along the direction X-X' after implanting p-type dopants into the doped regions to form p-type doped regions during an intermediate operation of a method of fabricating a semiconductor device according to one or more embodiments of the present invention.

FIG. 2 illustrates a cross-sectional view of the structure 100 along the direction X-X' after implanting p-type dopants (e.g., Ga, B, $BF_2$, or Al) into the doped regions 124 and 126 to form doped regions 200 and 202, respectively, during an intermediate operation of a method of fabricating a semiconductor device according to one or more embodiments of the present invention. In some embodiments, the p-type doping concentration in the doped regions 200 and 202 can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$. The thickness of the doped regions 200 and 202 (i.e., the depth of the p-type dopant ion implantation into the doped regions 124 and 126) is controlled by adjusting the implantation energy. In some embodiments, the thickness of the doped regions 200 and 202 is about 5 nm to about 30 nm. In some embodiments, the thickness of the doped regions 200 and 202 is about 20 nm.

Figure 6:
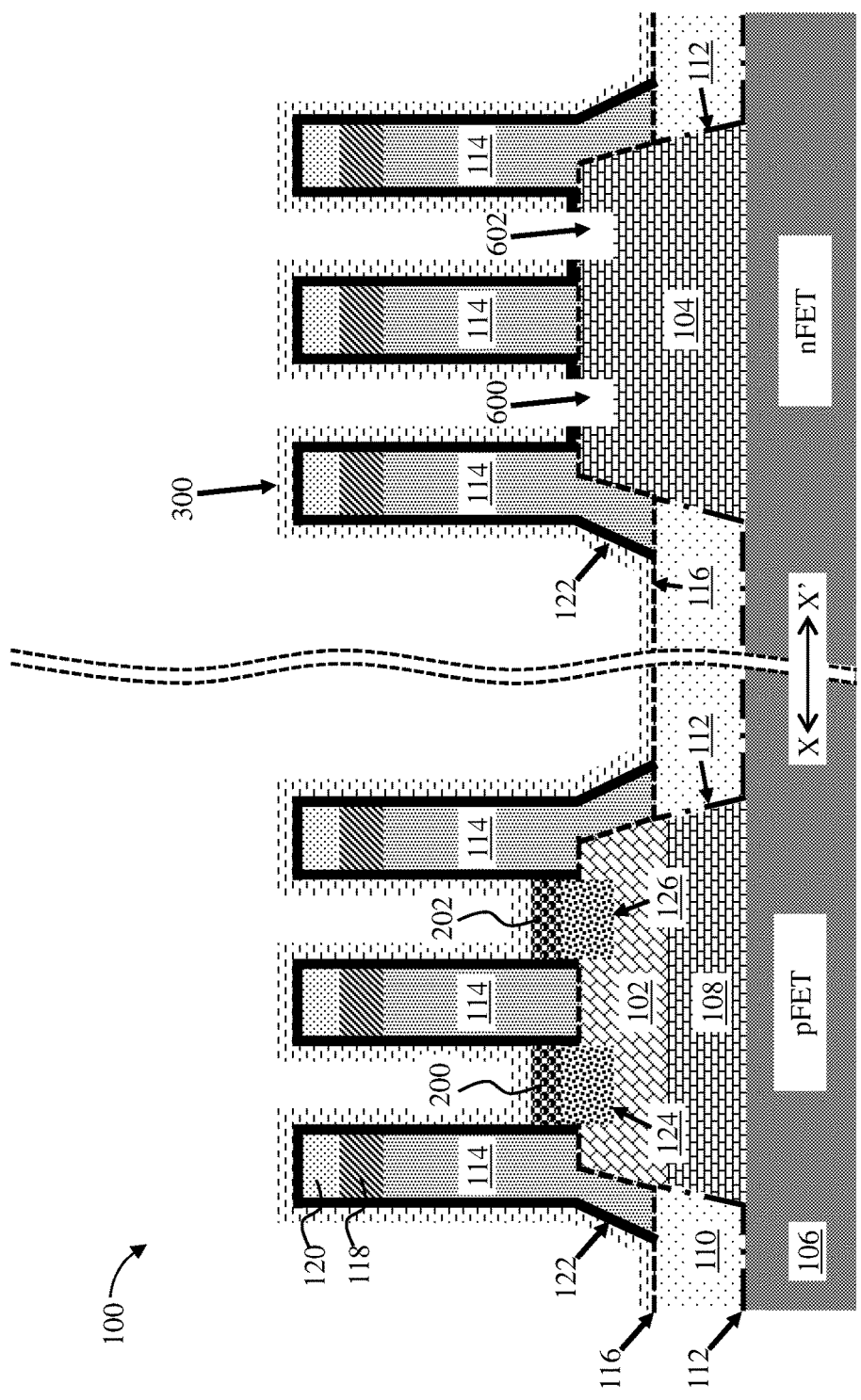
FIG. 6 depicts a cross-sectional view of the structure along the direction X-X' after removing the doped regions in the nFET regions to form n-fin recesses during an intermediate operation of a method of fabricating a semiconductor device according to one or more embodiments of the present invention.

In some embodiments, the doped regions 124 and 126 are doped using a blanket p-type dopant (e.g., Ga, B, $BF_2$, or Al) ion implantation process. In some embodiments, a block mask is formed over the nFET region prior to the blanket p-type dopant implantation to prevent p-type doping of the semiconductor fin 104. In other embodiments, a block mask is not formed in the nFET region and doped regions 204 and 206 are allowed to form in the semiconductor fin 104. The doped regions 204 and 206 are later removed (as depicted in FIG. 6). In this manner, an additional nFET hard mask is not required during the pFET doping process. In some embodiments, the semiconductor fin 104 is a Si fin and the doped regions 204 and 206 are p-type doped Si regions.

Figure 3:
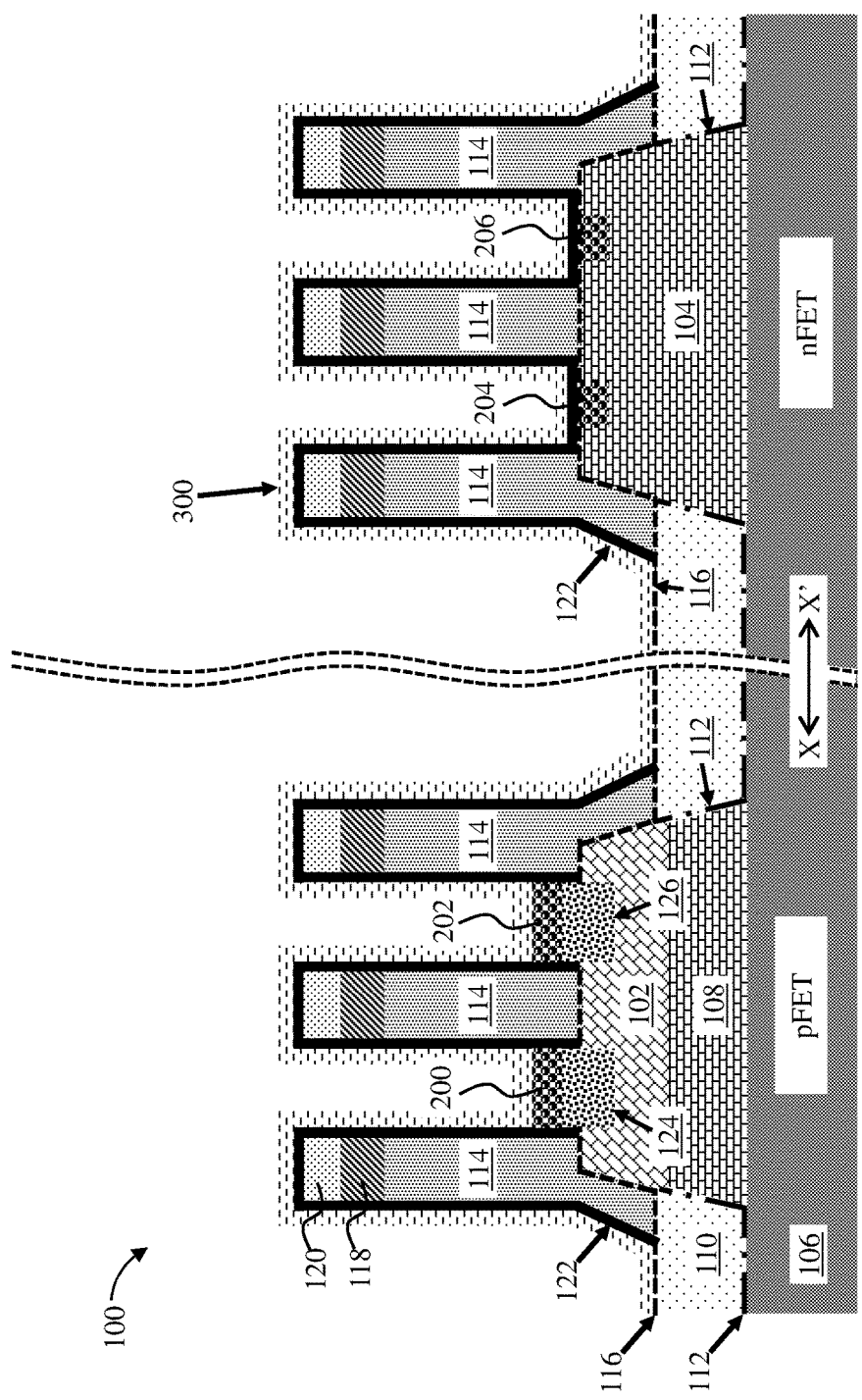
FIG. 3 depicts a cross-sectional view of the structure along the direction X-X' after forming a spacer over sacrificial gates, the semiconductor fins, and a dielectric layer during an intermediate operation of a method of fabricating a semiconductor device according to one or more embodiments of the present invention.

FIG. 3 illustrates a cross-sectional view of the structure 100 along the direction X-X' after forming a spacer 300 over the sacrificial gates 114, the semiconductor fins 102 and 104, and the dielectric layer 110 during an intermediate operation of a method of fabricating a semiconductor device according to one or more embodiments of the present invention. In some embodiments, the spacer 300 is formed using a CVD, PECVD, ALD, PVD, chemical solution deposition, or other like process in combination with a wet or dry etch process. In some embodiments, the spacer 300 is conformally formed over the sacrificial gates 114, the semiconductor fins 102 and 104, and the dielectric layer 110 to a thickness of about 10 nm to about 100 nm. The spacer 300 can be made of any suitable material, such as, for example, a low-k dielectric, a nitride, silicon nitride, silicon dioxide, SiON, SiC, SiOCN, or SiBCN. In some embodiments, the structure 100 is annealed after forming the spacer 300, but prior to forming the nFET source/drain (as depicted in FIG. 7). Any suitable annealing process can be used, such as, for example, laser spike annealing (LSA). In some embodiments, the structure 100 is annealed at a temperature of about 400 degrees Celsius to about 700 degrees Celsius.

Figure 4:
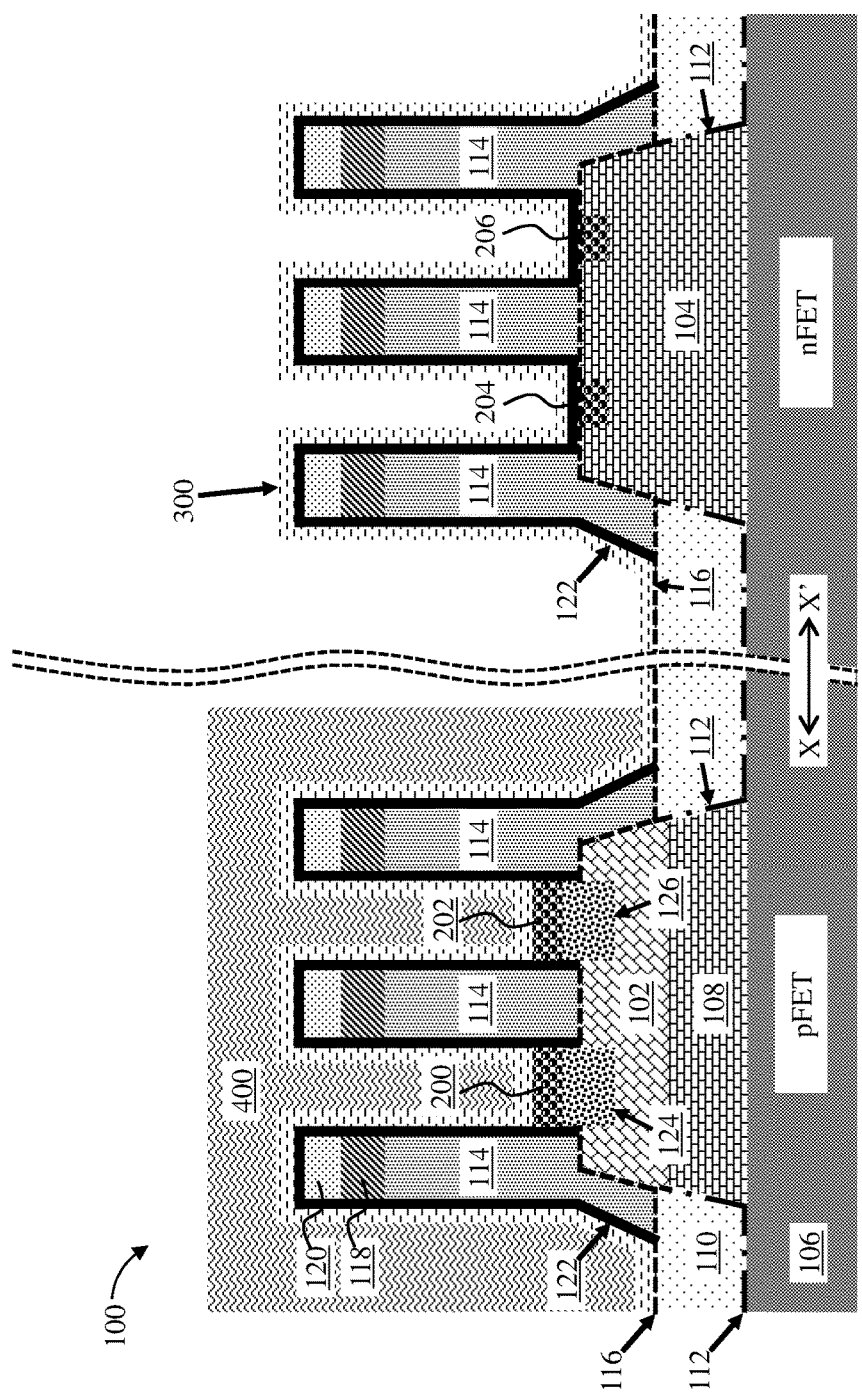
FIG. 4 depicts a cross-sectional view of the structure along the direction X-X' after forming a block mask over a pFET region during an intermediate operation of a method of fabricating a semiconductor device according to one or more embodiments of the present invention.

FIG. 4 illustrates a cross-sectional view of the structure 100 along the direction X-X' after forming a block mask 400 over the pFET region during an intermediate operation of a method of fabricating a semiconductor device according to one or more embodiments of the present invention. The block mask 400 can be made of any suitable material, such as, for example, a silicon nitride, silicon dioxide, SiON, SiC, SiOCN, or SiBCN. In some embodiments, the block mask 400 is an organic planarization layer (OPL).

Figure 5:
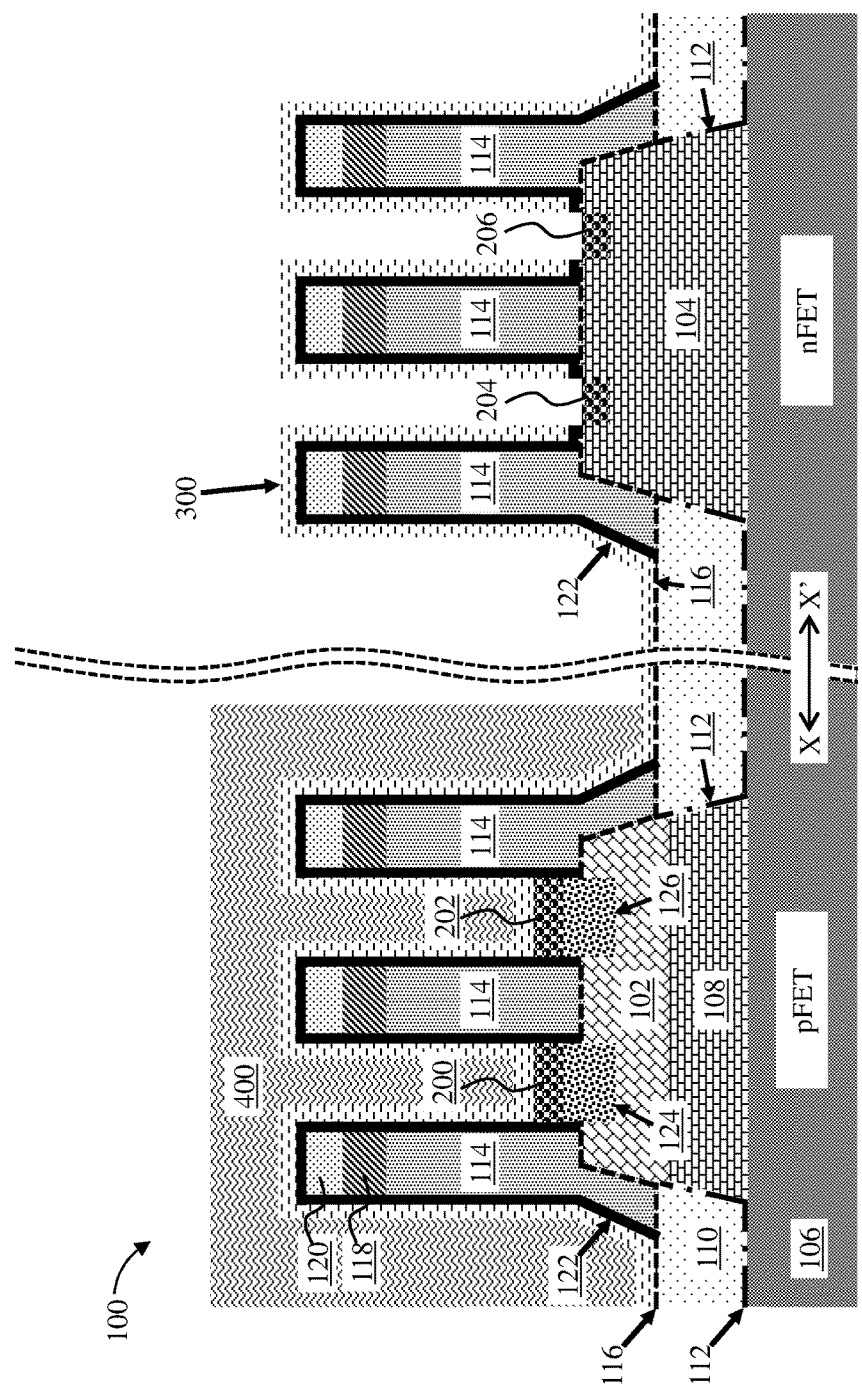
FIG. 5 depicts a cross-sectional view of the structure along the direction X-X' after removing portions of an oxide layer and spacers to expose a surface of the doped regions during an intermediate operation of a method of fabricating a semiconductor device according to one or more embodiments of the present invention.

FIG. 5 illustrates a cross-sectional view of the structure 100 along the direction X-X' after removing portions of the oxide layer 116, spacers 122, and spacer 300 to expose a surface of the doped regions 204 and 206 during an intermediate operation of a method of fabricating a semiconductor device according to one or more embodiments of the present invention. Any known method for removing portions of the oxide layer 116, spacers 122, and spacer 300 can be used, such as, for example, a wet etch, a dry etch, or a combination of sequential wet and/or dry etches. In some embodiments, the portions are removed using a RIE process selective to the doped regions 204 and 206.

FIG. 6 illustrates a cross-sectional view of the structure 100 along the direction X-X' after removing the doped regions 204 and 206 in the nFET regions to form n-fin recesses 600 and 602 during an intermediate operation of a method of fabricating a semiconductor device according to one or more embodiments of the present invention. Any known method for removing the doped regions 204 and 206 can be used, such as, for example, a wet etch, a dry etch, or a combination of sequential wet and/or dry etches. In some embodiments, the doped regions 204 and 206 are removed using a RIE process. In some embodiments, a material of the block mask 400 is selected such that the block mask 400 is also removed during the doped regions 204 and 206 RIE process. In this manner, only a single etch is required to remove both the block mask 400 and the doped regions 204 and 206.

FIG. 7 illustrates a cross-sectional view of the structure 100 along the direction X-X' after forming doped regions 700 and 702 in the n-fin recesses 600 and 602 during an intermediate operation of a method of fabricating a semiconductor device according to one or more embodiments of the present invention. In some embodiments, the doped regions 700 and 702 are embedded below a top surface of the semiconductor fin 104 (i.e., to completely fill the n-fin recesses 600 and 602). In some embodiments, the doped regions 700 and 702 extend above a surface of the semiconductor fin 104.

The doped regions 700 and 702 can be source or drain regions formed in a similar manner as the doped regions 124 and 126. The doped regions 700 and 702 can be formed, for example, by in-situ doped epitaxy, doping following the epitaxy, or by implantation and plasma doping. In some embodiments, the doped regions 700 and 702 are complementary, such that one of the doped regions is a source while the other is a drain. In embodiments having both nFET and pFET regions the doped regions 700 and 702 are n-type doped regions (nFET source/drain regions) and the doped regions 124 and 126 (as depicted in FIG. 1) are p-type doped regions. In some embodiments, the semiconductor fin 104 is a Si fin and the doped regions 700 and 702 are n-doped regions (i.e., doped using n-type dopants such as, for example, phosphorus or arsenic). The dopant concentration in the doped regions 700 and 702 can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

After forming the doped regions 700 and 702, the sacrificial gates are removed and conductive gates (not depicted) are formed over channel regions of the semiconductor fins 102 and 104 using known VFET processes. The conductive gates can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

In some embodiments, a high-k dielectric (not depicted) is formed between each of the conductive gates and the semiconductor fins 102 and 104. In some embodiments, the high-k dielectric modifies the work function of each respective gate. The high-k dielectrics can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectrics can have a thickness of about 0.5 nm to about 4 nm. In some embodiments, the high-k dielectrics can have a thickness of about 2 nm to about 3 nm, although other thicknesses are within the contemplated scope of the invention.

In some embodiments, work function layers (not depicted) are formed between each of the high-k dielectrics and the conductive gates. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layers further modify the work function of each respective gate.

Conductive contacts are then formed or deposited using known VFET metallization techniques. In some embodiments, an interlayer dielectric (ILD) is patterned with open trenches and the contacts are deposited into the trenches. In some embodiments, the contacts are overfilled into the trenches, forming overburdens above a surface of the ILD. In some embodiments, a CMP selective to the ILD removes the overburden. The contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 8:
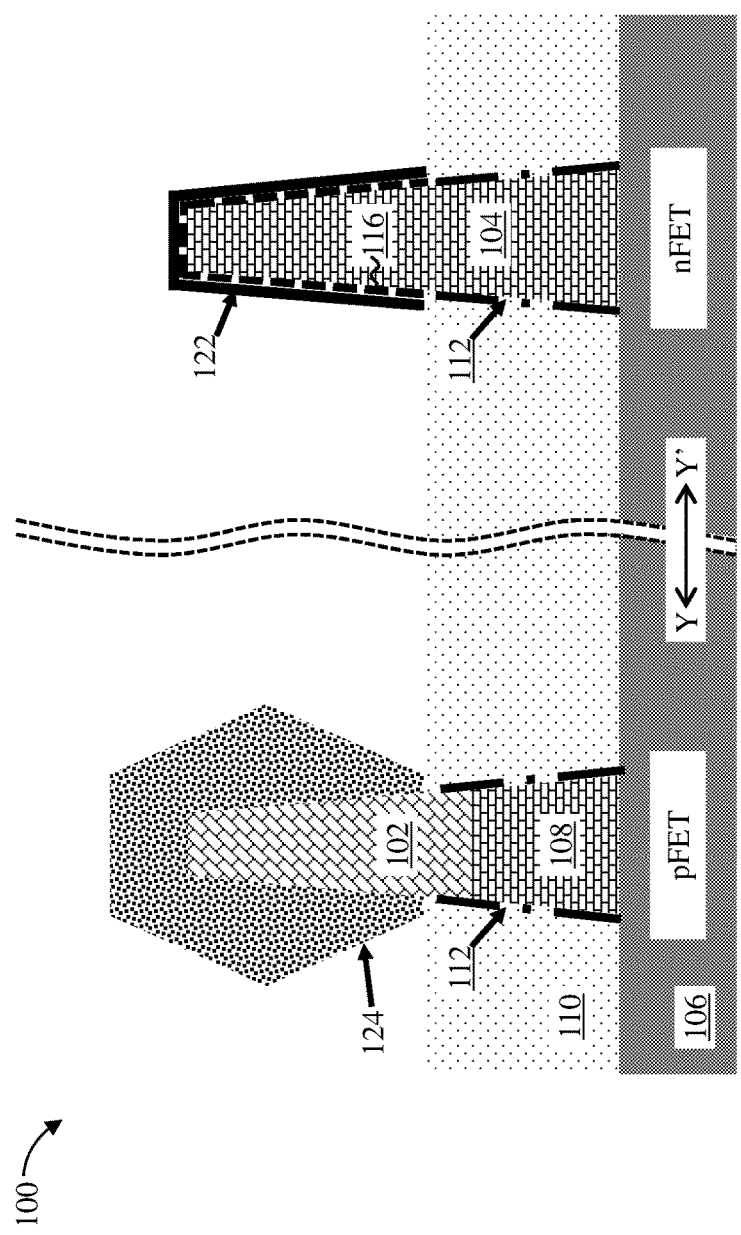
FIG. 8 depicts a cross-sectional view of the structure as depicted in FIG. 1 along a direction Y-Y' (perpendicular to fin direction and the direction X-X') after forming the semiconductor fins on the substrate during an intermediate operation of a method of fabricating a semiconductor device according to one or more embodiments of the present invention.

FIG. 8 illustrates a cross-sectional view of the structure 100 as depicted in FIG. 1 along a direction Y-Y' (perpendicular to fin direction) after forming the semiconductor fins 102 and 104 on the substrate 106 during an intermediate operation of a method of fabricating a semiconductor device according to one or more embodiments of the present invention. The direction Y-Y' is perpendicular to the direction X-X'. From this view it is clear that the doped region 124 extends out over the dielectric layer 110 from a surface of the semiconductor fin 102.

Figure 9:
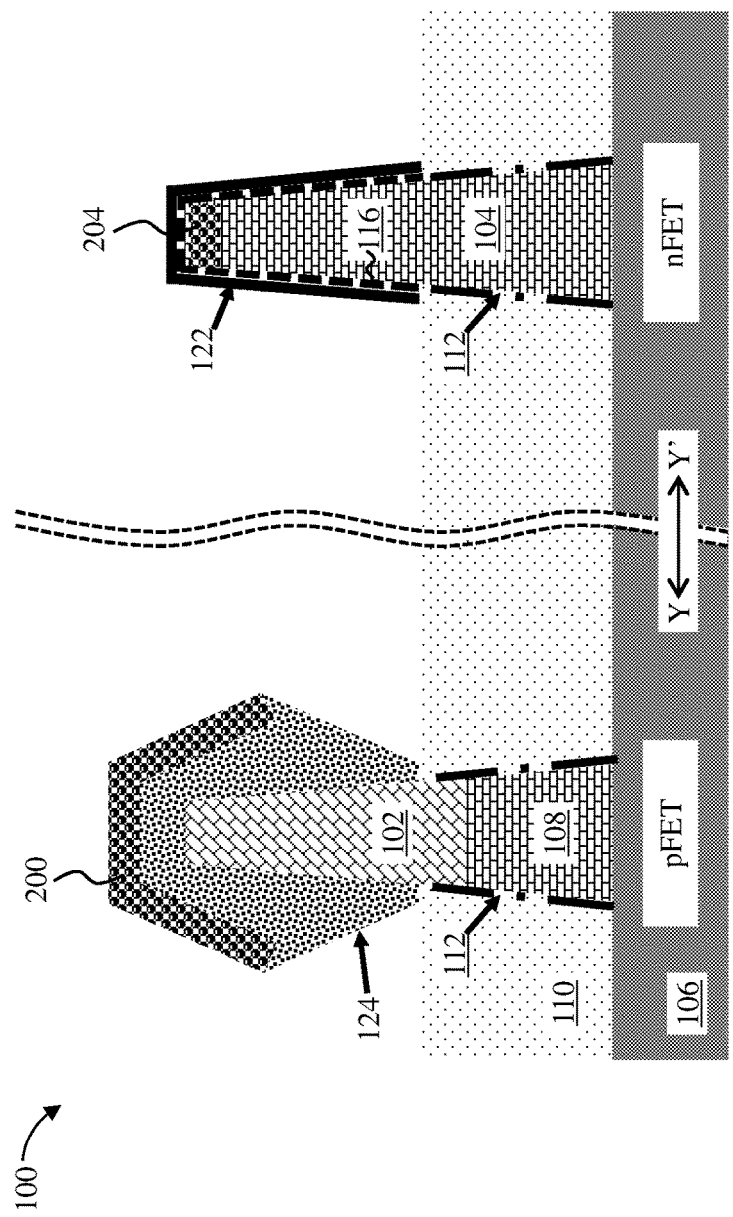
FIG. 9 depicts a cross-sectional view of the structure as depicted in FIG. 2 along the direction Y-Y' after implanting p-type dopants into the doped regions to form p-type doped regions during an intermediate operation of a method of fabricating a semiconductor device according to one or more embodiments of the present invention.

FIG. 9 illustrates a cross-sectional view of the structure 100 as depicted in FIG. 2 along the direction Y-Y' after implanting p-type dopants into the doped regions 124 and 126 to form doped regions 200 and 202, respectively, during an intermediate operation of a method of fabricating a semiconductor device according to one or more embodiments of the present invention. From this view it is clear that the p-type dopant ion implantation process dopes a top portion of the doped region 124 (forming the doped region 200).

Figure 10:
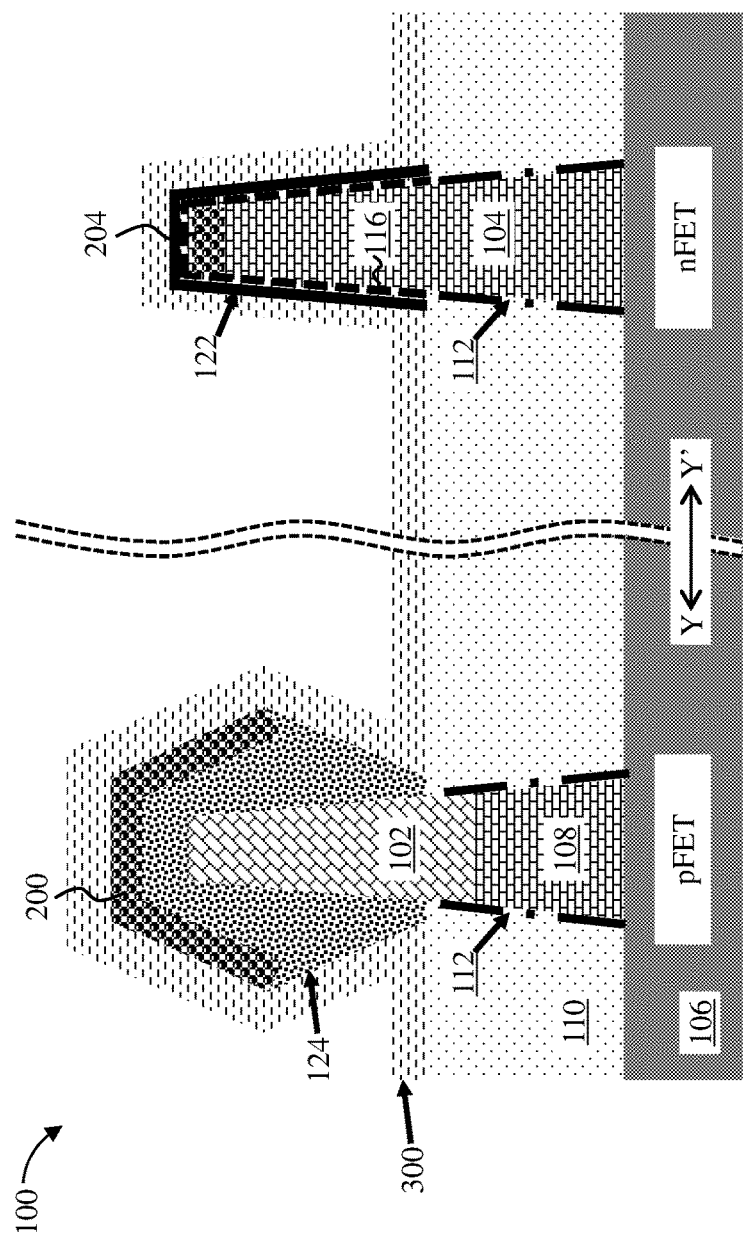
FIG. 10 depicts a cross-sectional view of the structure as depicted in FIG. 3 along the direction Y-Y' after forming the spacer over the sacrificial gates, the semiconductor fins, and the dielectric layer during an intermediate operation of a method of fabricating a semiconductor device according to one or more embodiments of the present invention.

FIG. 10 illustrates a cross-sectional view of the structure 100 as depicted in FIG. 3 along the direction Y-Y' after forming the spacer 300 over the sacrificial gates 114, the semiconductor fins 102 and 104, and the dielectric layer 110 during an intermediate operation of a method of fabricating a semiconductor device according to one or more embodiments of the present invention. From this view it is clear that the spacer 300 is formed over the doped regions 124, 200, and 204 along a direction perpendicular to the fins.

Figure 11:
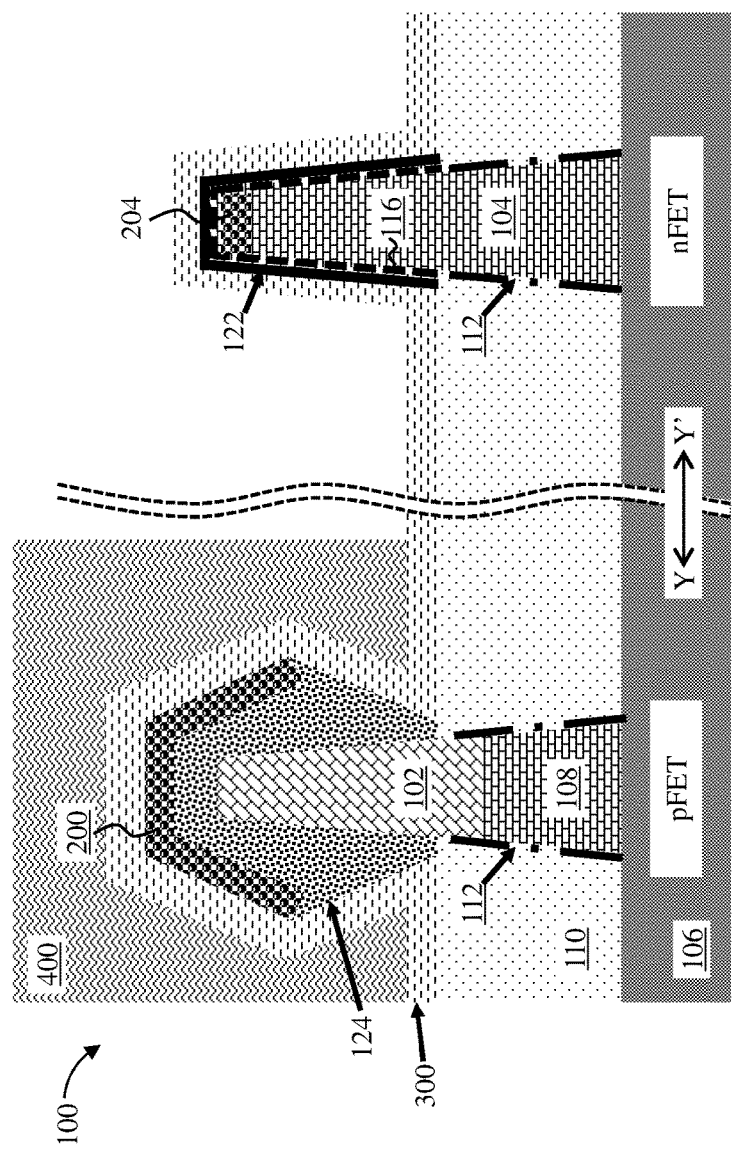
FIG. 11 depicts a cross-sectional view of the structure as depicted in FIG. 4 along the direction Y-Y' after forming a block mask over the pFET region during an intermediate operation of a method of fabricating a semiconductor device according to one or more embodiments of the present invention.

FIG. 11 illustrates a cross-sectional view of the structure 100 as depicted in FIG. 4 along the direction Y-Y' after forming a block mask 400 over the pFET region during an intermediate operation of a method of fabricating a semiconductor device according to one or more embodiments of the present invention.

Figure 12:
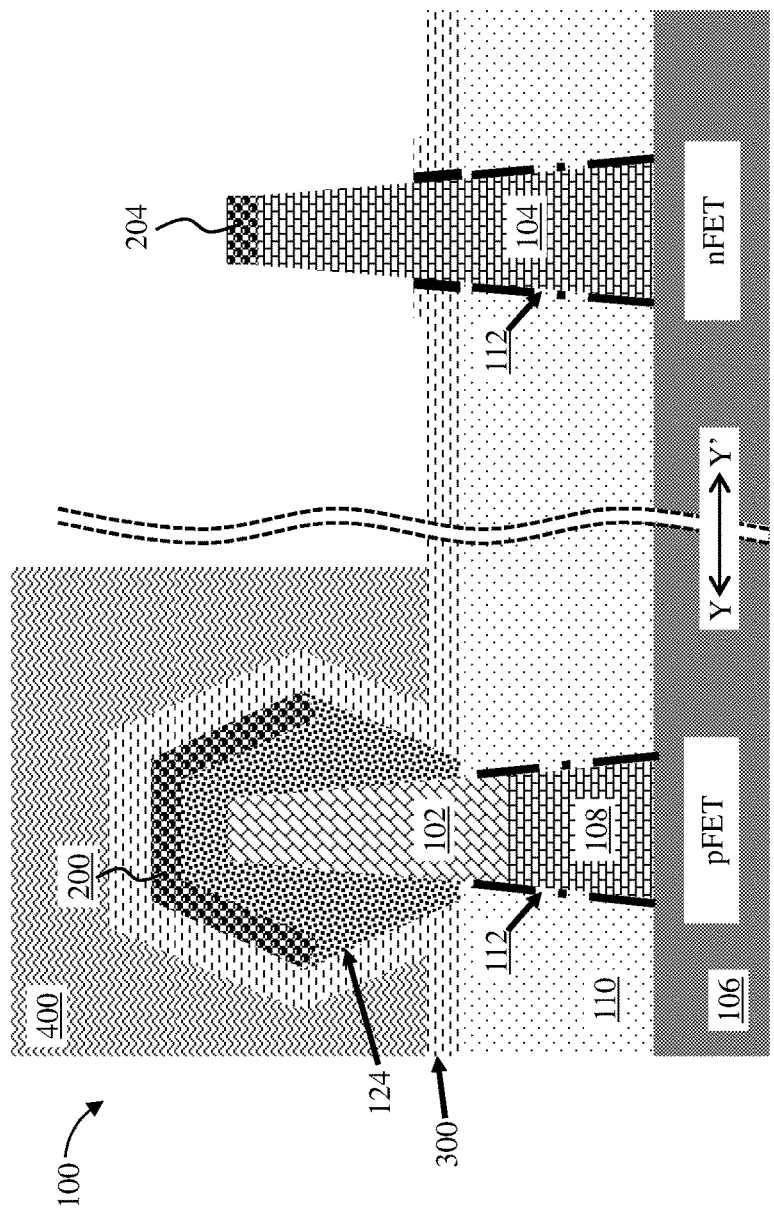
FIG. 12 depicts a cross-sectional view of the structure as depicted in FIG. 5 along the direction Y-Y' after removing portions of the oxide layer and spacers to expose a surface of the doped regions during an intermediate operation of a method of fabricating a semiconductor device according to one or more embodiments of the present invention.

FIG. 12 illustrates a cross-sectional view of the structure 100 as depicted in FIG. 5 along the direction Y-Y' after removing portions of the oxide layer 116, spacers 122, and spacer 300 to expose a surface of the doped regions 204 and 206 during an intermediate operation of a method of fabricating a semiconductor device according to one or more embodiments of the present invention. From this view it is clear that removing portions of the oxide layer 116, spacers 122, and spacer 300 exposes sidewalls of the semiconductor fin 104 as well as the surface of the doped region 204.

Figure 13:
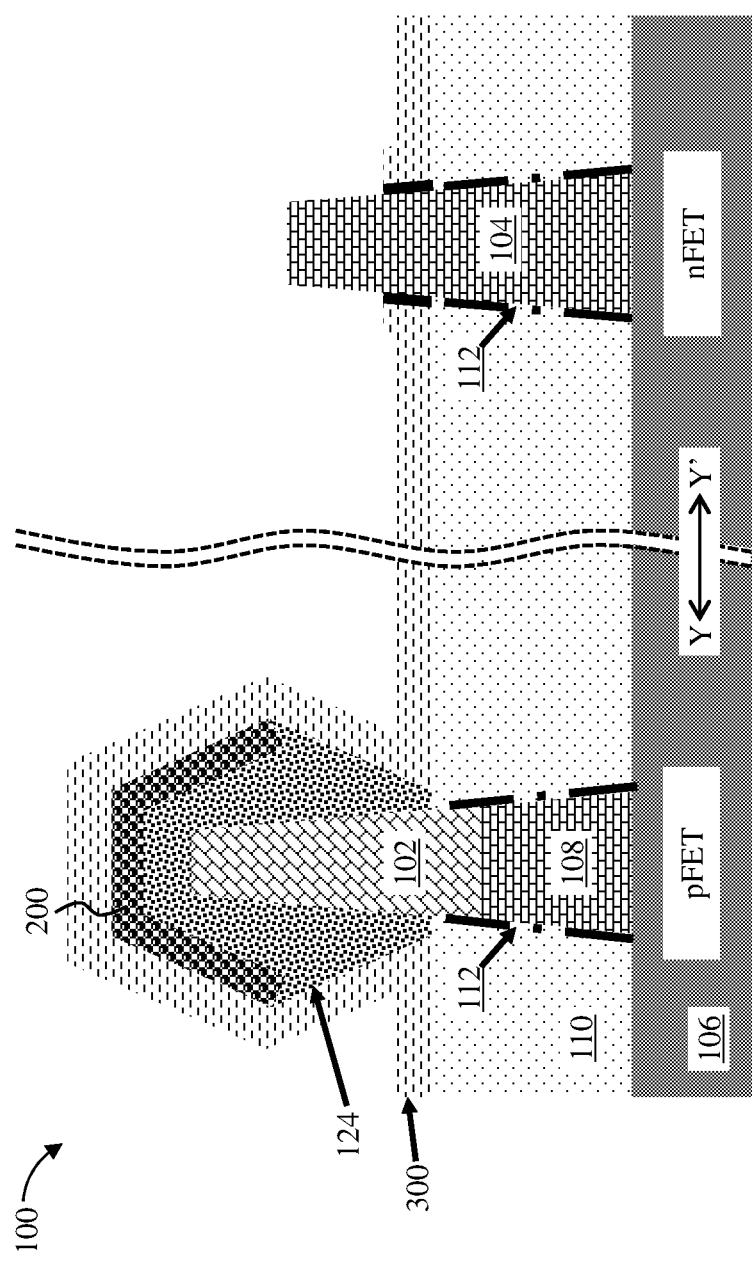
FIG. 13 depicts a cross-sectional view of the structure as depicted in FIG. 6 along the direction Y-Y' after removing the doped regions in the nFET regions to form n-fin recesses during an intermediate operation of a method of fabricating a semiconductor device according to one or more embodiments of the present invention.

FIG. 13 illustrates a cross-sectional view of the structure 100 as depicted in FIG. 6 along the direction Y-Y' after removing the doped regions 204 and 206 in the nFET regions to form n-fin recesses 600 and 602 during an intermediate operation of a method of fabricating a semiconductor device according to one or more embodiments of the present invention. From this view it is clear that portions of the semiconductor fin 104 can be removed concurrently with the doped regions 204 and 206 to slightly recess the semiconductor fin.

Figure 14:
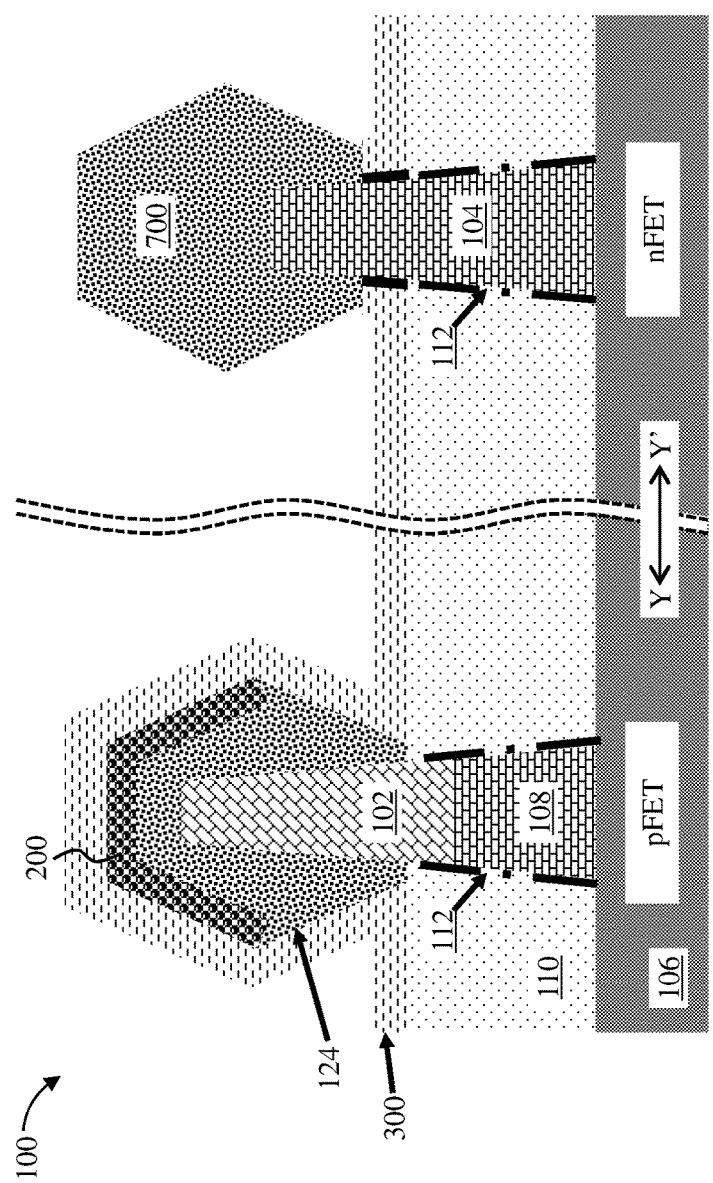
FIG. 14 depicts a cross-sectional view of the structure as depicted in FIG. 7 along the direction Y-Y' after forming doped regions in the n-fin recesses during an intermediate operation of a method of fabricating a semiconductor device according to one or more embodiments of the present invention.

FIG. 14 illustrates a cross-sectional view of the structure 100 as depicted in FIG. 7 along the direction Y-Y' after forming doped regions 700 and 702 in the n-fin recesses 600 and 602, respectively, during an intermediate operation of a method of fabricating a semiconductor device according to one or more embodiments of the present invention. From this view it is clear that the doped region 700 extends out over the dielectric layer 110 from a surface of the semiconductor fin 104.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
   forming a first semiconductor fin in a first region of a substrate and a second semiconductor fin in a second region of the substrate;
   forming a first gate over a first channel region of the first semiconductor fin and a second gate over a first channel region of the second semiconductor fin;
   forming a first doped region on the first semiconductor fin and adjacent to the first gate;
   forming a second doped region in a top portion of the first doped region and a third doped region in a top portion of the second semiconductor fin;
   removing the third doped region to form a recess in the second semiconductor fin; and
   forming a fourth doped region in the recess and adjacent to the second gate.

2. The method of claim 1, wherein forming the second and third doped regions further comprises concurrently forming the second and third doped regions during a blanket p-type dopant doping process.

3. The method of claim 1 further comprising annealing the second and third doped regions at a temperature within a range from about 400 degrees Celsius to about 700 degrees Celsius prior to forming the fourth doped region.

4. The method of claim 1, wherein a contact resistivity between the second doped region and the first gate comprises less than about $2.5 \times 10^{-9}$ $\Omega \cdot cm^{-2}$.

5. The method of claim 1, wherein the first semiconductor fin comprises silicon germanium (SiGe) and the second semiconductor fin comprises silicon (Si).

6. The method of claim 5, wherein a concentration of Ge in the first semiconductor fin comprises about 20 percent.

7. The method of claim 5, wherein a thickness of the second doped region is within a range from about 5 nm to about 30 nm.

8. The method of claim 1, wherein the first doped region comprises silicon germanium (SiGe), and wherein a concentration of germanium (Ge) in the first doped region is within a range from about 40 percent to about 90 percent.

9. The method of claim 8, wherein the second doped region comprises SiGe and a p-type dopant, and wherein a concentration of the p-type dopant in the second doped region is operable to reduce a contact resistivity between the second doped region and the first gate to less than about $2.5 \times 10^{-9}$ $\Omega \cdot cm^2$.

10. A method for forming a semiconductor device, the method comprising:
    forming a first semiconductor fin in a first region of a substrate and a second semiconductor fin in a second region of the substrate;
    forming a first plurality of adjacent gates, each gate formed over a channel region of the first semiconductor fin;
    forming a second plurality of adjacent gates, each gate formed over a channel region of the second semiconductor fin;
    forming a plurality of first doped regions on the first semiconductor fin, each of the first doped regions formed between adjacent gates;
    concurrently forming a plurality of second doped regions and a plurality of third doped regions, each of the second doped regions formed in a top portion of a first doped region and each of the third doped regions formed in a top portion of the second semiconductor fin; and
    removing the plurality of third doped regions to form a plurality of recesses in the second semiconductor fin; and
    forming a plurality of fourth doped regions, each of the fourth doped regions formed in a recess.

11. The method of claim 10, wherein forming the pluralities of the second and third doped regions further comprises a single blanket p-type dopant doping process.

12. The method of claim 10 further comprising annealing the plurality of second and third doped regions at a temperature within a range from about 400 degrees Celsius to about 700 degrees Celsius prior to forming the plurality of fourth doped regions.

13. The method of claim 10, wherein a contact resistivity between each of the second doped regions and a gate of the first plurality of adjacent gates comprises less than about $2.5 \times 10^{-9}$ $\Omega \cdot cm^{-2}$.

14. The method of claim 10, wherein the first semiconductor fin comprises silicon germanium (SiGe) and the second semiconductor fin comprises silicon (Si).

15. The method of claim 14, wherein a concentration of Ge in the first semiconductor fin comprises about 20 percent.

16. The method of claim 14, wherein a thickness of the second doped region is within a range from about 5 nm to about 30 nm.

17. The method of claim 10, wherein each of the first doped regions comprises silicon germanium (SiGe), and wherein a concentration of germanium (Ge) in each of the first doped regions is within a range from about 40 percent to about 90 percent.

18. The method of claim 17, wherein each of the second doped regions comprises SiGe and a p-type dopant, and wherein a concentration of the p-type dopant in each of the second doped regions is operable to reduce a contact resistivity between each of the second doped regions and a gate of the first plurality of adjacent gates to less than about $2.5 \times 10^{-9}$ $\Omega \cdot cm^{-2}$.

* * * * *